United States Patent
Anderson et al.

(10) Patent No.: US 7,700,446 B2
(45) Date of Patent: Apr. 20, 2010

(54) VIRTUAL BODY-CONTACTED TRIGATE

(75) Inventors: Brent A. Anderson, Jericho, VT (US); Matthew J. Breitwisch, Essex Junction, VT (US); Edward J. Nowak, Essex Junction, VT (US); BethAnn Rainey, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 11/830,868

(22) Filed: Jul. 31, 2007

(65) Prior Publication Data

US 2008/0176363 A1 Jul. 24, 2008

Related U.S. Application Data

(62) Division of application No. 11/161,213, filed on Jul. 27, 2005, now Pat. No. 7,288,802.

(51) Int. Cl.
*H01L 21/336* (2006.01)
(52) U.S. Cl. .................. 438/283; 257/270; 257/E29.13
(58) Field of Classification Search ......... 438/282–284, 438/277, 267, 195, 157; 257/270, 282–284, 257/277, 267, 195, 157
See application file for complete search history.

(56) References Cited

U.S. PATENT DOCUMENTS

| | | | |
|---|---|---|---|
| 4,946,799 A | 8/1990 | Blake et al. | |
| 5,289,027 A | 2/1994 | Terrill et al. | |
| 5,627,395 A | 5/1997 | Witek et al. | |
| 5,929,490 A | 7/1999 | Onishi | |
| 5,963,817 A | 10/1999 | Chu et al. | |
| 6,111,778 A | 8/2000 | MacDonald et al. | |
| 6,391,752 B1 | 5/2002 | Colinge et al. | |
| 6,407,427 B1 | 6/2002 | Oh | |
| 6,437,405 B2 | 8/2002 | Kim | |
| 6,583,469 B1 | 6/2003 | Fried et al. | |
| 6,642,090 B1 | 11/2003 | Fried et al. | |
| 6,657,258 B2 | 12/2003 | Bae | |
| 6,716,684 B1 | 4/2004 | Krivokapic et al. | |
| 6,759,282 B2 | 7/2004 | Campbell et al. | |
| 6,759,710 B2 | 7/2004 | Chan et al. | |
| 6,762,483 B1 | 7/2004 | Krivokapic et al. | |
| 6,774,437 B2 | 8/2004 | Bryant et al. | |
| 6,787,404 B1 | 9/2004 | Lee et al. | |
| 6,800,513 B2 | 10/2004 | Horiuchi et al. | |

(Continued)

*Primary Examiner*—Kiesha R Bryant
*Assistant Examiner*—Mark W Tornow
(74) *Attorney, Agent, or Firm*—Gibbs I.P. Law Firm, LLC; Richard M. Kotulak, Esq.

(57) ABSTRACT

A field effect transistor (FET) and method of forming the FET comprises a substrate; a silicon germanium (SiGe) layer over the substrate; a semiconductor layer over and adjacent to the SiGe layer; an insulating layer adjacent to the substrate, the SiGe layer, and the semiconductor layer; a pair of first gate structures adjacent to the insulating layer; and a second gate structure over the insulating layer. Preferably, the insulating layer is adjacent to a side surface of the SiGe layer and an upper surface of the semiconductor layer, a lower surface of the semiconductor layer, and a side surface of the semiconductor layer. Preferably, the SiGe layer comprises carbon. Preferably, the pair of first gate structures are substantially transverse to the second gate structure. Additionally, the pair of first gate structures are preferably encapsulated by the insulating layer.

19 Claims, 25 Drawing Sheets

U.S. PATENT DOCUMENTS

| | | |
|---|---|---|
| 7,456,476 B2 * | 11/2008 | Hareland et al. ............ 257/349 |
| 2001/0052613 A1 | 12/2001 | Higashi et al. |
| 2003/0052347 A1 | 3/2003 | Fung |
| 2004/0036118 A1 | 2/2004 | Abadeer et al. |
| 2004/0145000 A1 * | 7/2004 | An et al. .................... 257/270 |
| 2004/0185626 A1 | 9/2004 | Yang |
| 2004/0256647 A1 | 12/2004 | Lee et al. |
| 2005/0035415 A1 | 2/2005 | Yeo et al. |
| 2005/0093028 A1 | 5/2005 | Chambers |
| 2005/0189589 A1 | 9/2005 | Zhu et al. |
| 2005/0224800 A1 * | 10/2005 | Lindert et al. ................ 257/66 |
| 2006/0043616 A1 | 3/2006 | Anderson et al. |

* cited by examiner

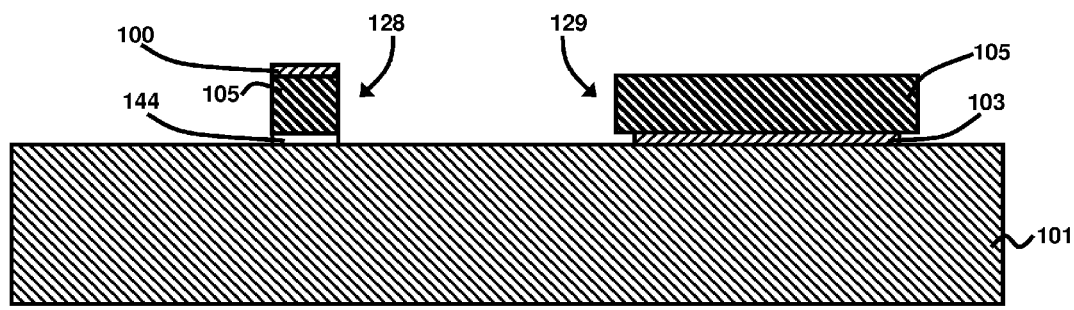
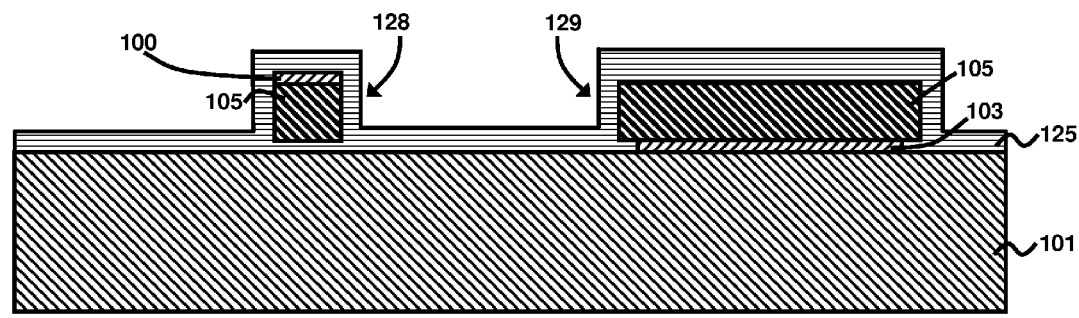

VIRTUAL BODY-CONTACTED TRIGATE

CROSS-REFERENCE TO RELATED APPLICATIONS

This application is a divisional of U.S. application Ser. No. 11/161,213 filed Jul. 27, 2005, now U.S. Pat. No. 7,288,802 the complete disclosure of which, in its entirety, is herein incorporated by reference.

BACKGROUND OF THE INVENTION

1. Field of the Invention

The embodiments of the invention generally relate to semiconductor devices, and, more particularly, to a field effect transistor (FET) device.

2. Description of the Related Art

Hybrid orientation technology (HOT) provides surfaces for PFET inversion layers and surfaces for NFET inversion layers. A low-cost means of achieving HOT technology results in the device bodies of one type of FET being isolated by oxide (silicon on insulator (SOI)) and the other being physically connected to the bulk wafer. Trigate devices have been shown in HOT but generally lack a means of electrical threshold voltage ($V_t$) adjustment. Setting the height of the fin in a trigate device on bulk silicon is generally critical because the design requires that the width and the height be controlled to assure full depletion and controlled short-channel effects.

Trigate technology has been proposed for extending scaling of complementary metal oxide semiconductor (CMOS) technology beyond the 65 nm node. Additionally, bulk FinFET integration schemes have been introduced that provide either junction-isolated or oxide-isolated FinFETs. Moreover, as devices physically diminish in size, threshold voltage control by doping generally becomes increasingly ineffective due to dopant fluctuations in the individual devices. Additionally, $V_t$ control is becoming a major barrier to the further scaling of CMOS devices. Therefore, there remains a need for a device which is better capable of controlling threshold voltage in FET devices.

SUMMARY OF THE INVENTION

In view of the foregoing, an embodiment of the invention provides a field effect transistor (FET) comprising a substrate; a silicon germanium (SiGe) layer over the substrate; a semiconductor layer over and adjacent to the SiGe layer; an insulating layer adjacent to the substrate, the SiGe layer, and the semiconductor layer; a pair of first gate structures adjacent to the insulating layer; and a second gate structure over the insulating layer. Preferably, the insulating layer is adjacent to a side surface of the SiGe layer and an upper surface of the semiconductor layer, a lower surface of the semiconductor layer, and a side surface of the semiconductor layer. Preferably, the SiGe layer comprises carbon. Preferably, the pair of first gate structures are substantially transverse to the second gate structure. Additionally, the pair of first gate structures are preferably encapsulated by the insulating layer.

Another embodiment of the invention provides an integrated circuit comprising a substrate; a silicon germanium (SiGe) layer adjacent to the substrate; a first field effect transistor (FET) adjacent to the substrate; and a second FET adjacent to the SiGe layer, wherein the first FET may comprise any of a FinFET and a trigate structure, wherein the second FET may comprise any of a FinFET and a trigate structure, and wherein the first FET may comprise a semiconductor layer over the substrate; an insulating layer over the semiconductor layer; a dielectric layer over the semiconductor layer; and a polysilicon layer over the dielectric layer and the insulating layer. Moreover, the second FET may comprise a semiconductor layer over the SiGe layer; a dielectric layer over the semiconductor layer and adjacent to the SiGe layer; and a polysilicon layer over the dielectric layer and adjacent to the SiGe layer. Furthermore, the SiGe layer may comprise carbon. The integrated circuit may further comprise a plurality of implant well regions in the substrate, wherein at least one of the implant well regions contact the SiGe layer. Additionally, the integrated circuit may further comprise a plurality of implant well regions in the substrate, wherein at least one of the implant well regions contact the semiconductor layer.

Another aspect of the invention provides a transistor comprising a silicon substrate; a silicon germanium (SiGe) layer over the silicon substrate; a first field effect transistor (FET) over the silicon substrate; and a second FET contacting the SiGe layer, wherein the first FET preferably comprises any of a FinFET and a trigate structure, and wherein the second FET preferably comprises a partially depleted FET structure. Preferably, the first FET comprises a semiconductor layer over the silicon substrate; an insulating layer over the semiconductor layer; a dielectric layer over the semiconductor layer; and a polysilicon layer over the dielectric layer and the insulating layer. Moreover, the second FET may comprise a semiconductor layer over the SiGe layer; a dielectric layer over the semiconductor layer and adjacent to the SiGe layer; and a polysilicon layer over the dielectric layer and adjacent to the SiGe layer. Also, the SiGe layer preferably comprises carbon. Preferably, the transistor further comprises a plurality of implant well regions in the substrate, wherein at least one of the implant well regions contact the SiGe layer. Also, the transistor may further comprise a plurality of implant well regions in the substrate, wherein at least one of the implant well regions contact the semiconductor layer. Preferably, the transistor further comprises an insulating layer in between the first FET and the silicon substrate. Furthermore, the transistor may comprise a space-charge region in the insulating layer. Additionally, the transistor preferably further comprises a body region in between the second FET and the substrate, the body region being substantially planar to the SiGe layer. Preferably, the transistor further comprises a neutral region in the body region. Moreover, the first FET preferably comprises a first width and the second FET comprises a second width, wherein the second width is greater than the first width.

Another embodiment of the invention provides a method of manufacturing a field effect transistor (FET), wherein the method comprises forming a silicon germanium (SiGe) layer over a substrate; depositing a semiconductor layer over and adjacent to the SiGe layer; configuring an insulating layer adjacent to the substrate, the SiGe layer, and the semiconductor layer; positioning a pair of first gate structures adjacent to the insulating layer; and forming a second gate structure over the insulating layer, wherein the configuring may comprise forming the insulating layer adjacent to a side surface of the SiGe layer and an upper surface of the semiconductor layer, a lower surface of the semiconductor layer, and a side surface of the semiconductor layer. Preferably, the configuring comprises encapsulating the pair of first gate structures by the insulating layer.

Another aspect of the invention provides a method of fabricating a transistor, wherein the method comprises forming a silicon germanium (SiGe) layer over a silicon substrate; configuring a first field effect transistor (FET) over the silicon substrate; and contacting a second FET to the SiGe layer, wherein the configuring preferably comprises contacting the first FET to the silicon substrate, and wherein the configuring preferably comprises forming a semiconductor layer over the silicon substrate; forming an insulating layer over the semiconductor layer; forming a dielectric layer over the semiconductor layer; and forming a polysilicon layer over the dielectric layer and the insulating layer. Preferably, the second FET is formed by positioning a semiconductor layer over the SiGe layer; positioning a dielectric layer over the semiconductor layer and adjacent to the SiGe layer; and positioning a polysilicon layer over the dielectric layer and adjacent to the SiGe layer. The method may further comprise forming an insulating layer in between the first FET and the substrate and in between the second FET and the substrate. Additionally, the method may further comprise configuring the first FET with a first width and configuring the second FET with a second width, wherein the second width is greater than the first width.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 24 through 35(B) illustrate successive fabrication schematic diagrams of an integrated circuit structure according to a fourth embodiment of the invention.

DETAILED DESCRIPTION OF PREFERRED EMBODIMENTS OF THE INVENTION

Figure 1:
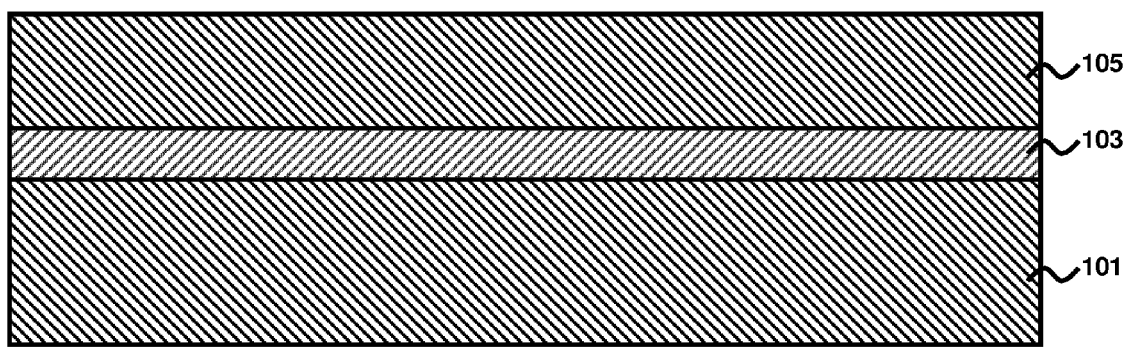
FIGS. 1 through 8(B) illustrate successive fabrication schematic diagrams of an integrated circuit structure according to a first embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a device which is better capable of controlling threshold voltage in FET devices. The embodiments of the invention achieve this by providing structures having self-aligned body contacted SiGe-based devices in a trigate configuration. Referring now to the drawings, and more particularly to FIGS. 1 through 35(B), where similar reference characters denote corresponding features consistently throughout the figures, there are shown preferred embodiments of the invention.

FIGS. 1 through 9(B) illustrate a first embodiment of the invention. First, as shown in FIG. 1, the structure of the first embodiment of the invention is formed by first beginning with a semiconductor (for example, silicon) wafer 101 having a preferred thickness of approximately 200 to 500 µm. Preferably, the wafer 101 comprises bulk silicon having a {100} crystalline orientation. Thereafter, a layer 103 of silicon germanium (SiGe) layer (for example, a p-type SiGe layer), optionally, with carbon, is epitaxially grown on the silicon wafer 101 using molecular beam epitaxy (MBE), Atomic Layer Deposition (ALD), or chemical vapor deposition (CVD) techniques, at a preferred growth temperature of approximately 550° C. For example, up to 1% carbon, by weight, may be added to the SiGe layer 103 to alleviate strain in the SiGe layer 103. The SiGe layer preferably has an approximate thickness between 15 to 50 nm.

Figure 2:
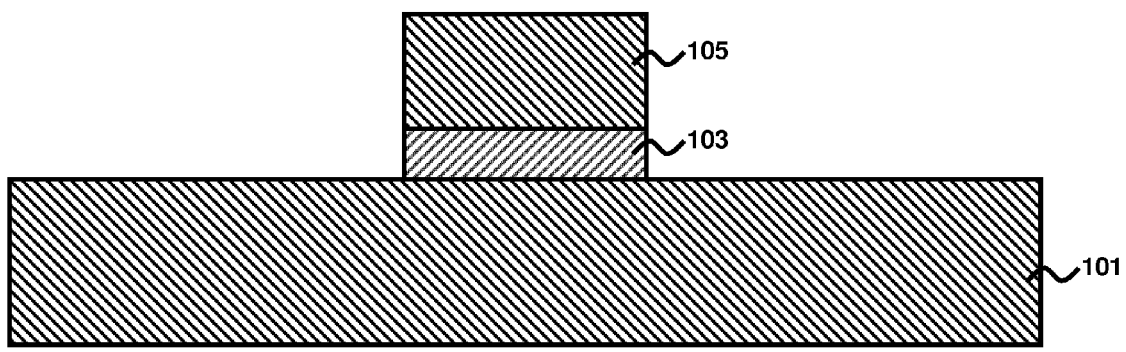

Next, another layer of silicon 105 is epitaxially grown over the SiGe layer 103 using well-known MBE or CVD techniques. Preferably, the silicon layer 105 comprises silicon having a {100} crystalline orientation and a preferred thickness in the approximate range of 7 to 50 nm. Use of {100} silicon enables use of high-mobility planes for subsequently formed channels. Next, as shown in FIG. 2, the trigate body is defined by etching the upper silicon layer 105, and then using an etch which etches the exposed SiGe layer 103 selectively with respect to silicon, stopping on the lower silicon wafer 101. The etching process may be accomplished using plasma etching, reactive ion etching (RIE), wet etching, or any other well-known etching process suitable for metal oxide semiconductor (MOS) devices. Thereafter, end portions of the SiGe layer 103 are selectively removed to undercut the remaining top silicon region 105, using an isotropic etch technique, such as a selective etch or by a thermal oxidation at approximately 600° C. which oxidizes SiGe at a much greater rate than Si, followed by an isotropic $SiO_2$ etch.

Figure 3:
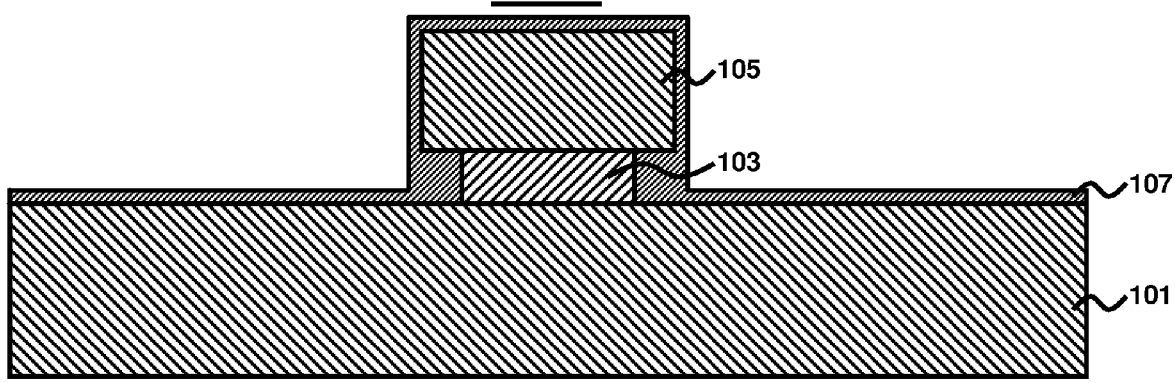
Figure 4:
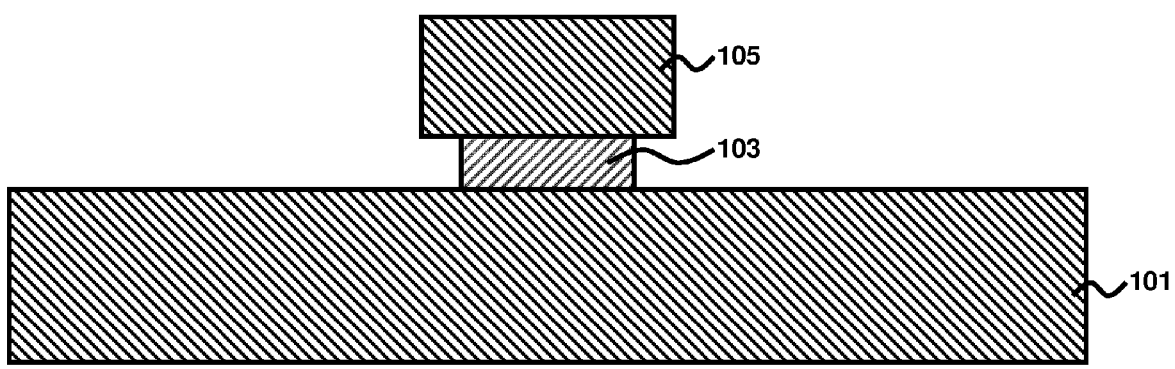
Figure 5:
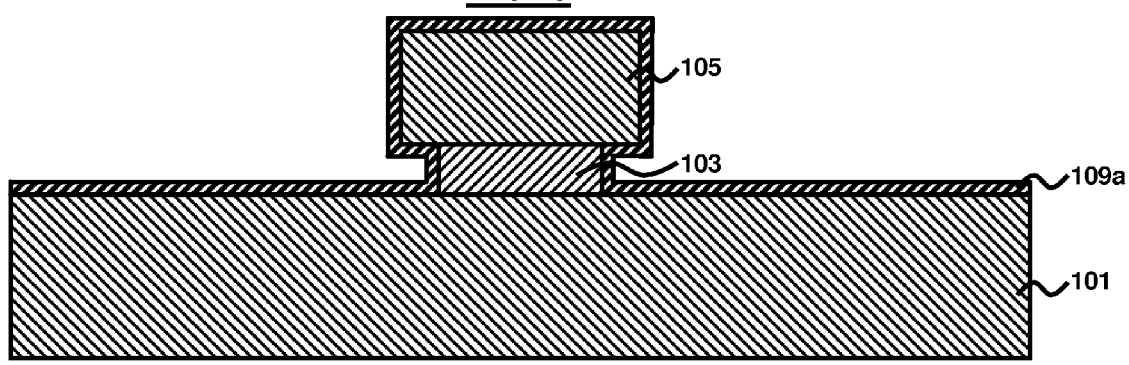
Figure 6A:
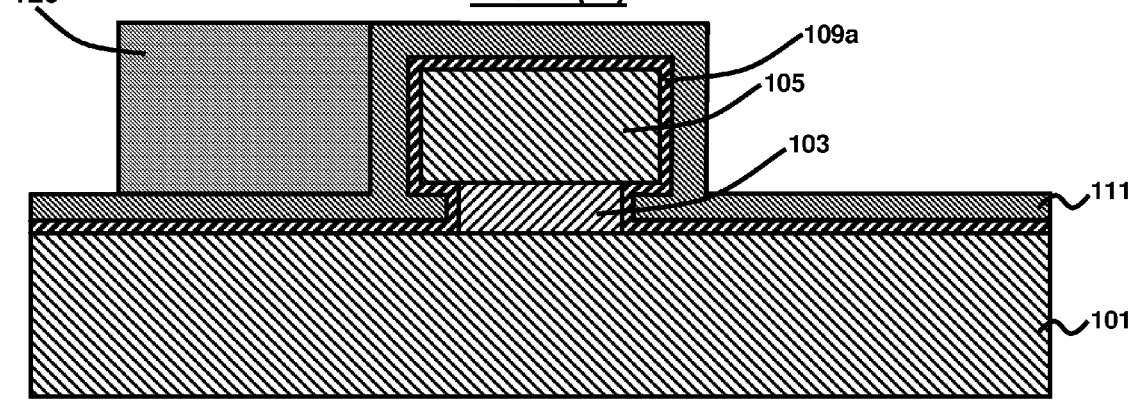
Figure 6B:
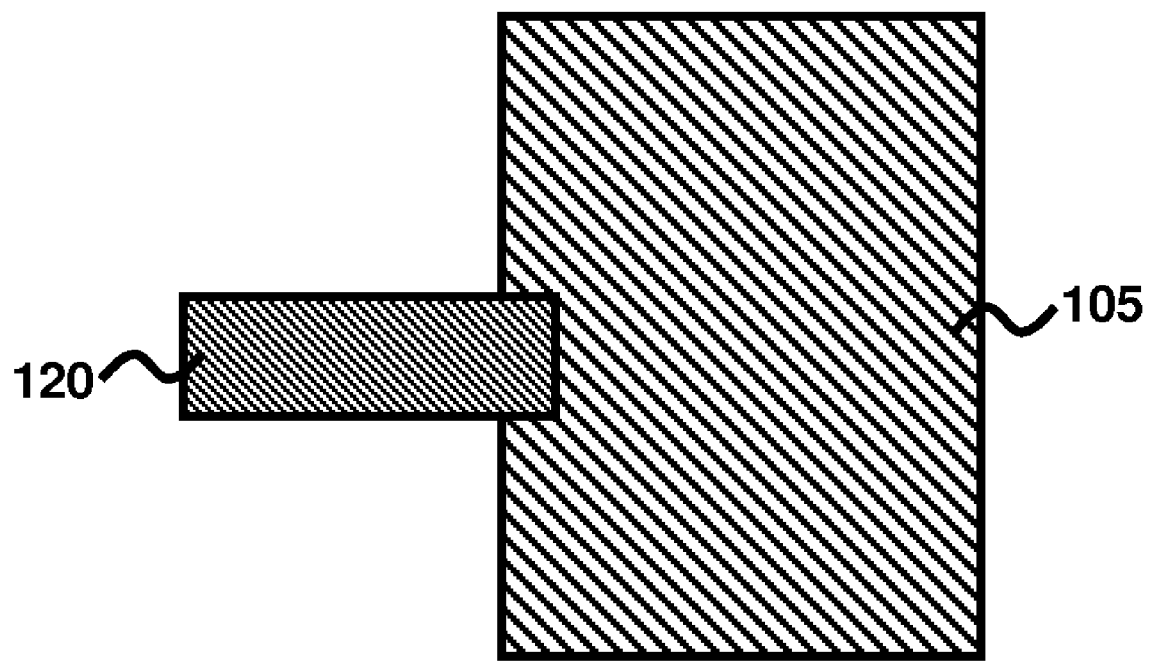

As illustrated in FIG. 3, a sacrificial oxide 107 is thermally grown over the device using a high-temperature oxidation, preferably at approximately 900° C. Next, as shown in FIGS. 4 and 5 the oxide layer 107 is removed using a wet etch, preferably a buffered hydrofluoric (HF) solution, and a gate-quality dielectric 109a is grown or deposited. This dielectric 109a may comprise silicon dioxide or nitridized silicon dioxide, or any of the high-k dielectrics such as hafnium silicate, hafnium dioxide, etc. As shown in FIGS. 6(A) and 6(B), a polysilicon layer 111 is deposited using a conformal deposition process such as CVD, which will form the body gate of the eventual trigate device. Polysilicon layer 111 is preferably of sufficient thickness to completely fill the region undercutting upper silicon region 105, and preferably has an approximate thickness between 6 and 200 nm.

Next, a resist 120 is deposited on the polysilicon layer 111 and planarized by, for example, spin-on and etch back processes, until the top of the portion of the polysilicon layer 111 above the silicon body region 105 is exposed. The resist 120 is then patterned by conventional photolithography processes.

Figure 7:
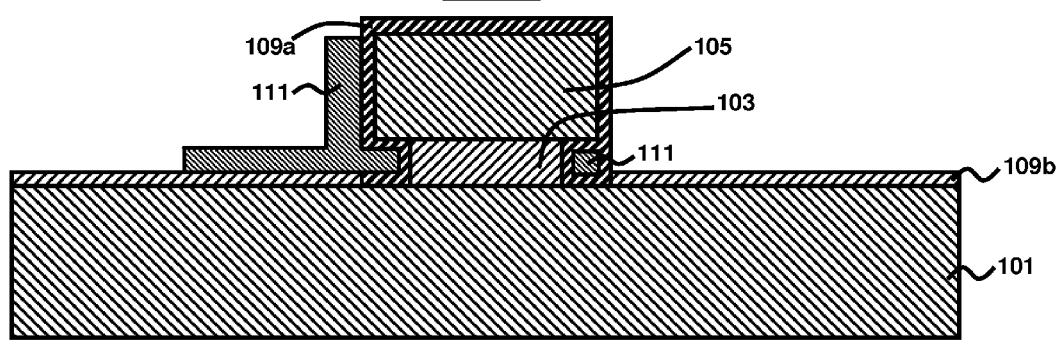
Figure 8A:
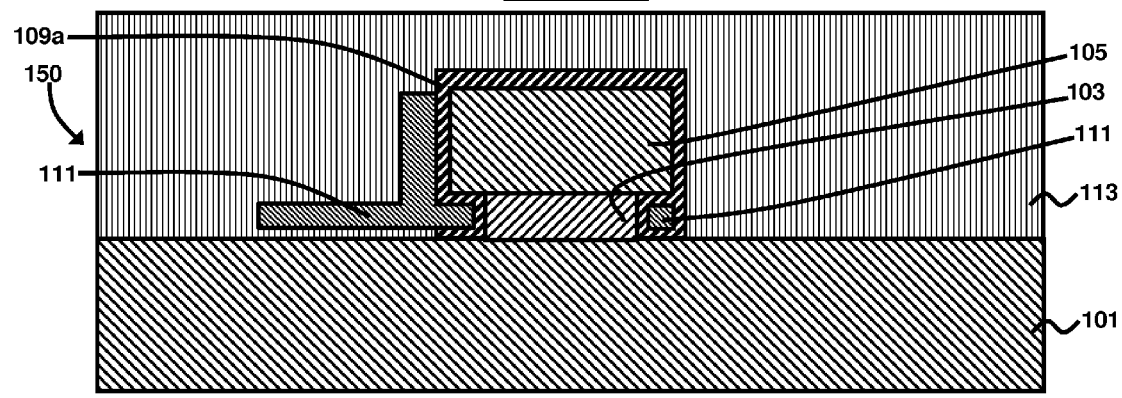
Figure 8B:
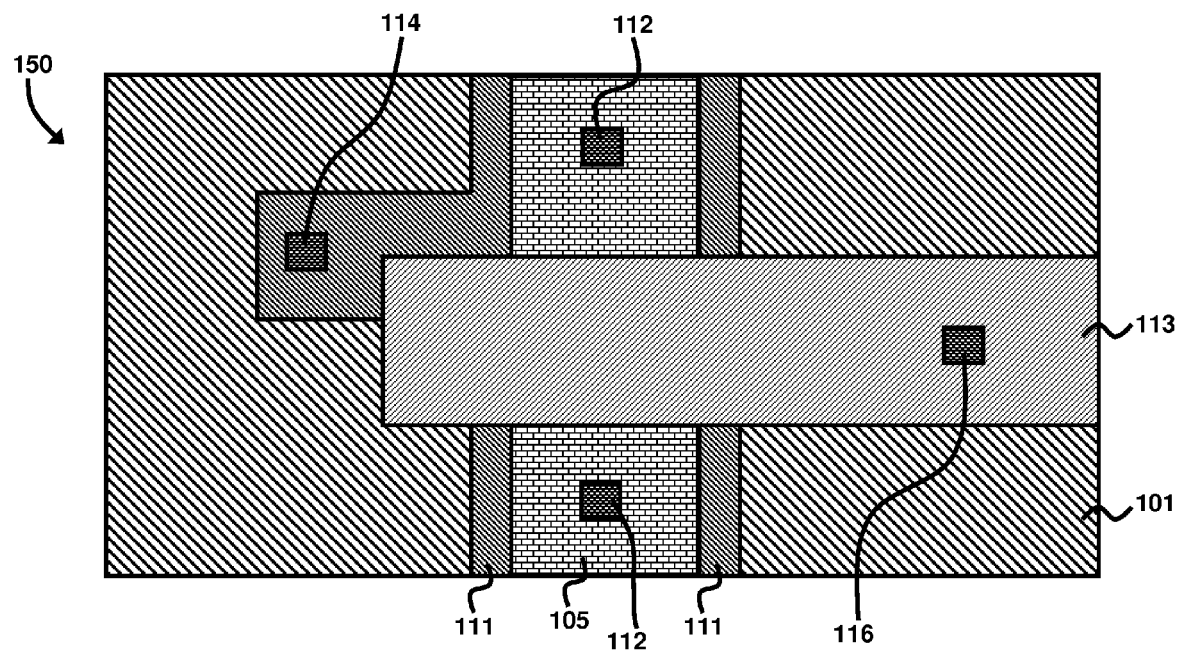

Thereafter, an anisotropic RIE process is performed to etch portions of the polysilicon layer 111 and oxide layer 109a to expose the lower and upper silicon layers 101, 105, respectively. The remaining portion of polysilicon 111, anchoring the sides of the SiGe layer 103 serve as the body gate of the device and the remaining portions of polysilicon 111, where protected by resist 120, serves as a contact region of the device. A third dielectric layer 109b is subsequently grown through thermal oxidation and/or nitridation of the exposed silicon surfaces or a high-k dielectric deposited, by CVD or ALD techniques over the exposed portions of the device as illustrated in FIG. 7. Dielectric layer 109a preferably has an approximate thickness between 1 and 50 nm, and conformally blends with dielectric layer 109a in the areas surrounding the polysilicon body gate regions 111. Moreover, oxide layer 109b serves as the gate oxide for the eventual field effect transistor (FET) portion of the device. Then, the FET gate is constructed by depositing (using, for example, CVD) a polysilicon layer 113 over the oxide layer 109b, as illustrated in FIGS. 8(A) and 8(B) to create a trigate structure (two body gates 111 and a FET gate 113). Polysilicon layer 113 preferably has a height at least twice the height of the fin (silicon region 105). Additionally, source/drain contacts 112, a main gate contact 116, and a body gate contact 114 are formed on the device 150 using well-known processes.

The first embodiment of the invention provides an effective and inexpensive trigate semiconductor structure 150 and method for fabrication on bulk silicon wafers 101. The first embodiment of the invention provides a gated body contact 114 which provides good control of the trigate fin height on bulk silicon 101 by providing an etch-stop material which allows the height of the fin 105 to be largely independent on the exact silicon etch time. Furthermore, the gated body contact 114 allows for the trigate fins 105 to have a charge injected into the body, which enables $V_t$ changes, yet allows for the body potential to dynamically vary, or "float", as needed. Thus, deleterious body effects such as dependence of $V_t$ on substrate bias, and loss of channel drive, can be averted by gating the body contact 114 "off" with a voltage more positive than a threshold voltage (in the case of an n-type FET, or the reverse for a p-type FET).

Specifically, the body contact 114 from the substrate 101 to the trigate FET body 111 is electrically continuous only when the body contact gate 114 is below a threshold voltage, at which point the body contact 114, surrounded by the body contact gate 111, is accumulated and becomes electrically conductive (the reverse is true for a p-type trigate FET). Thus, flexibility for optimal operation is achieved in one structure. Accordingly, the device 150 is at least partly isolated by the effect of an electrical field applied to a semiconductor material.

Accordingly, the first embodiment of the invention provides for the isolation of bulk trigate fins 105 from the substrate 101 with (1) well-controlled fin height, which is key to $V_t$ control in the trigate, (2) well-controlled isolation of the bulk parasitic channel (not shown), and (3) the opportunity to selectively "float" the body of the trigate device by the application of a cut-off voltage to the isolation gate 113.

Figure 9:
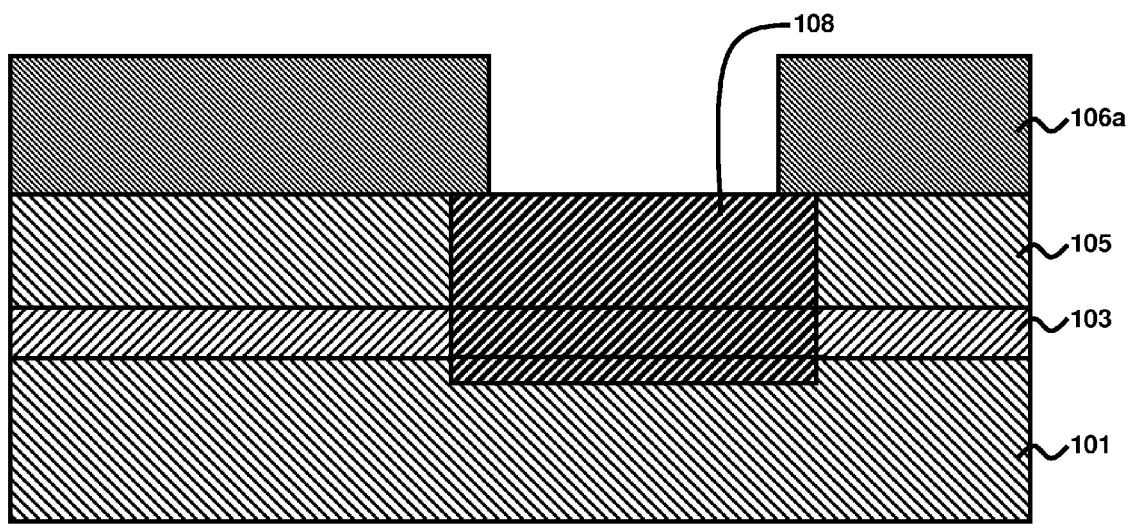
FIGS. 9 through 14 illustrate successive fabrication schematic diagrams of an integrated circuit structure according to a second embodiment of the invention.
Figure 10:
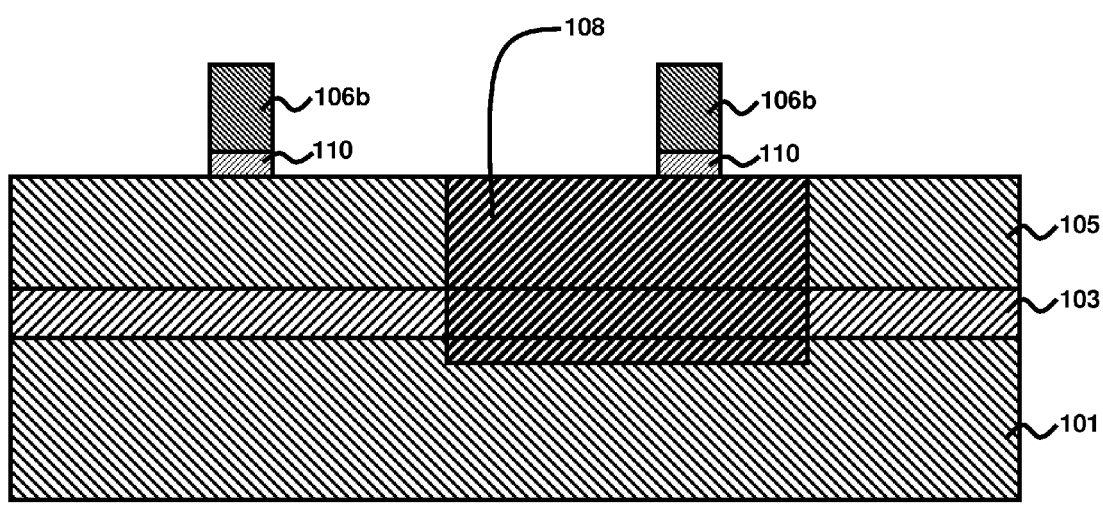

In the second embodiment of the invention illustrated in FIGS. 9 through 14, the same base substrate as was provided in the first embodiment including the wafer 101, SiGe layer 103, and silicon layer 105 is formed. Thereafter, as shown in FIG. 9, a first mask 106a is patterned over the silicon layer 105 to expose a portion of the underlying silicon layer 105. A deep implant well region 108 is formed using well-known ion implantation techniques. For example, the well region 108 may serve as the eventual p-well region of the device. Depending on the ion implantation parameters, the well region 108 may alternatively serve as the eventual n-well region of the device. Next, as illustrated in FIG. 10 a hard-mask 110 is deposited over silicon 105 and may have an approximate thickness between 5 and 50 nm. Hard-mask 110 preferably comprises silicon dioxide and/or silicon nitride and is preferably formed using oxidation/nitridation or CVD techniques.

Figure 11:
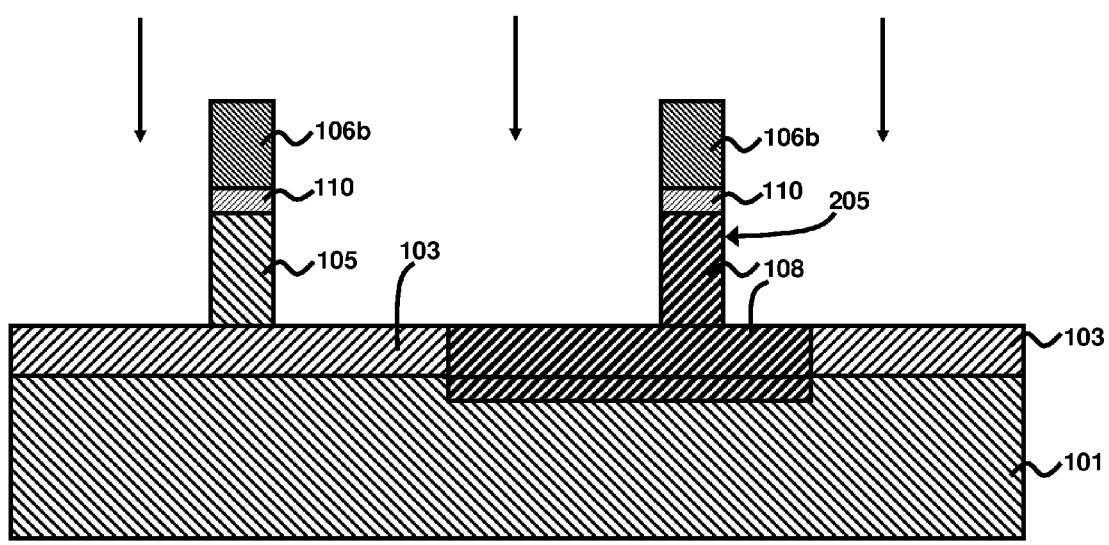

Thereafter, a second mask 106b is formed over the hard-mask layer 110 upon which portions of the mask 106b and underlying hard-mask layer 110 are selectively etched as shown in FIG. 10 down to the layer of the underlying silicon layer 105. Next, after stripping the second mask 106b, another etching process occurs, as shown in FIG. 11, to remove exposed regions of the silicon layer 105, exposing portions of SiGe layer 103. The left-hand fin 105 in FIG. 11 will generally become the NFET portion of the device and the right-hand fin 205 in FIG. 11 will generally become the PFET portion of the device. Of course, those skilled in the art would readily recognize that the NFET and PFET portions could be flipped (i.e., right-hand fin 205 becomes NFET and left-hand fin 105 becomes PFET) depending on the initial ion implantation parameters when the initial implant well region 108 was performed. An optional oxygen ion implantation process (as generally denoted by the downward arrows in FIG. 11) may also be performed.

Figure 12:
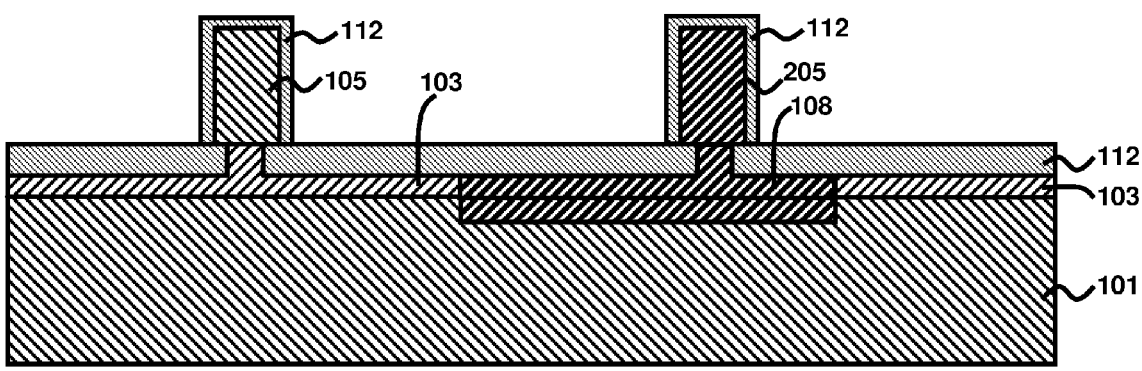
Figure 13:
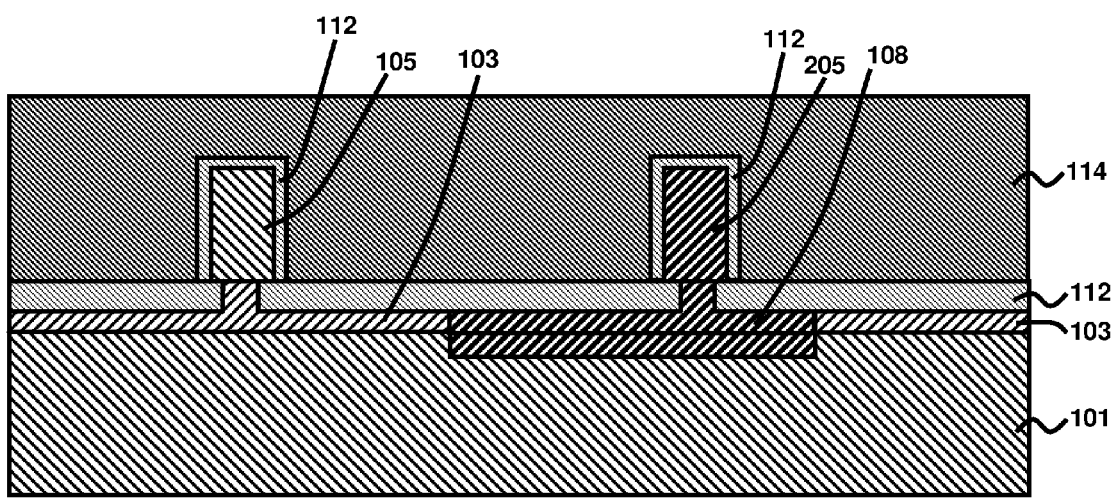
Figure 14:
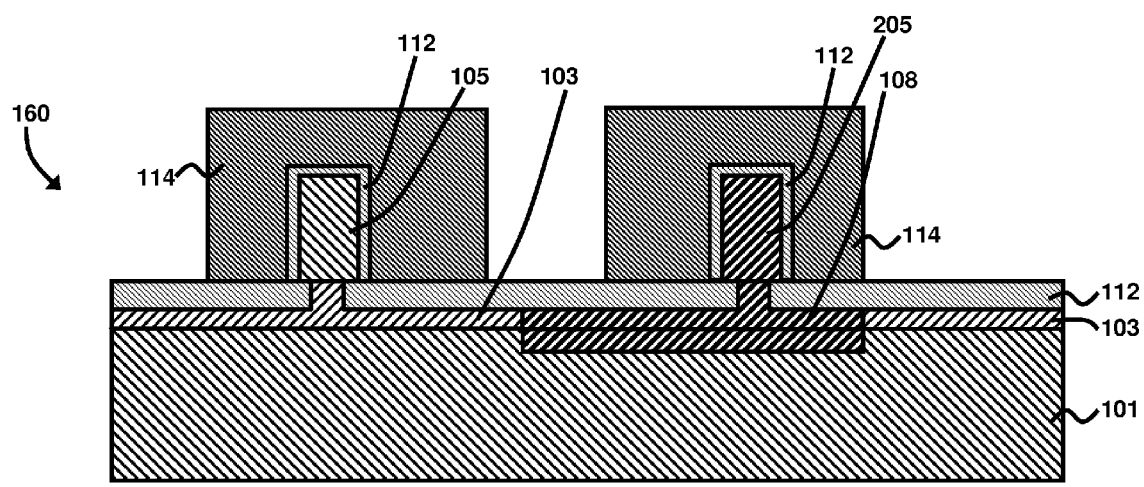

Next, as shown in FIG. 12, the remaining regions of hard-mask layer 110 are etched, using buffered HF or RIE, and an oxide layer 112 is formed over the exposed portions of the device. The oxide layer 112 is formed in an approximate 600° C. oxidation environment, which oxidizes SiGe at a greatly enhanced rate over that of Si. As shown in FIG. 13, a polysilicon layer 114 is deposited over the device using CVD techniques, and preferably having an approximate thickness between 12 and 150 nm, or about twice the height of the trigate fins 105, 205, and the polysilicon layer 114 is planarized. Thereafter, as shown in FIG. 14, the polysilicon layer 114 is selectively patterned and etched using well-known techniques to create a trigate structure 160. The trigate structure 160 comprises a semiconducting fin 105, 205, channel planes (not shown) on the top and left and right sides of the fin 105, 205, a gate dielectric 112 on the channel planes, and a gate electrode 114 contiguous to the gate dielectric regions 112.

The second embodiment of the invention provides a structure and method capable of providing the electrical setting of the $V_t$ in a trigate CMOS device 160 in a manner that provides for the precise control of the fin height. The height of the fin 105, 205 is given by the thickness of silicon region 105, which is enabled by the selective etch/oxidation properties of the SiGe layer 103. Furthermore, for trigate structures the ratio of the width of the fin 105, 205 to the height of the fin 105, 205 is in a ratio preferably between 2:1 and 1:2. Furthermore, voltage can be applied to the retrograde well 108 to alter or control the $V_t$.

Figure 15:
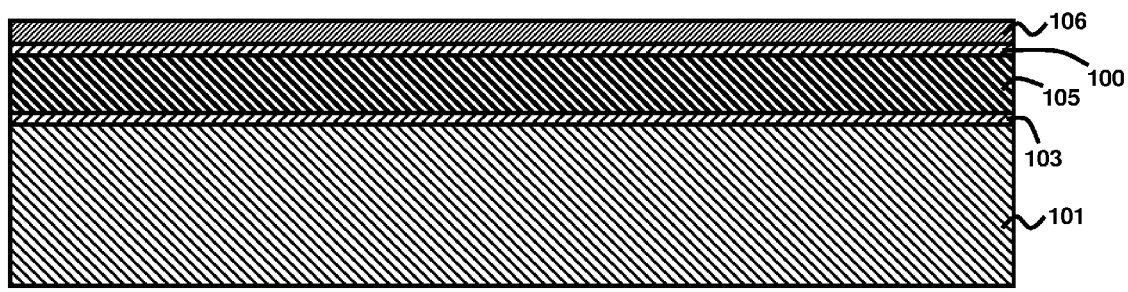
FIGS. 15 through 23 illustrate successive fabrication schematic diagrams of an integrated circuit structure according to a third embodiment of the invention.
Figure 16:
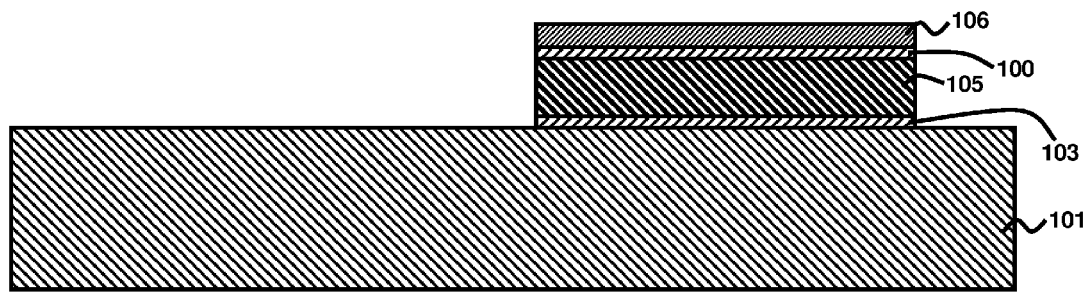

A third embodiment of the invention is illustrated in FIGS. 15 through 23. A hybrid SOI base substrate is provided comprising a silicon substrate 101 with first surface orientation, a buried oxide region, 103, and silicon region 105 with second surface orientation. Preferably, the substrate 101 will have a surface orientation of {100} and the second silicon region 105 will have surface orientation of {110}, although the opposite, and other combinations are possible. Thereafter, as shown in FIG. 15, a silicon dioxide ($SiO_2$) layer 100 and a silicon nitride ($Si_3N_4$) layer 106 are sequentially deposited over the silicon layer 105. $SiO_2$ layer 100 preferably has an approximate thickness between 5 and 50 nm while $Si_3N_4$ layer 106 preferably has an approximate thickness between 5 and 50 nm. Next, a selective etching process is performed, as shown in FIG. 16, to remove portions of the buried oxide layer 103, silicon layer 105, SiO$_2$ layer 100, and Si$_3$N$_4$ layer 106, thereby exposing portions of the underling substrate layer 101.

Figure 17:
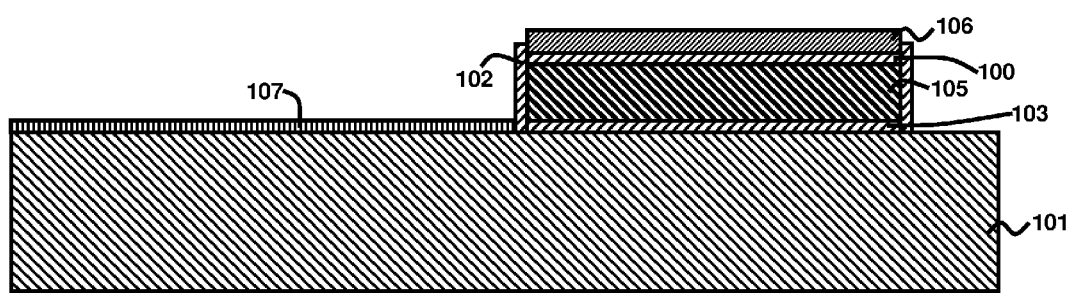
Figure 18:
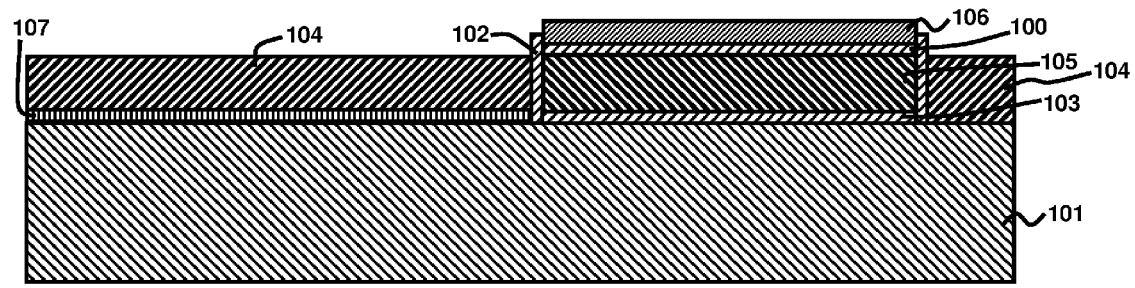
Figure 19:
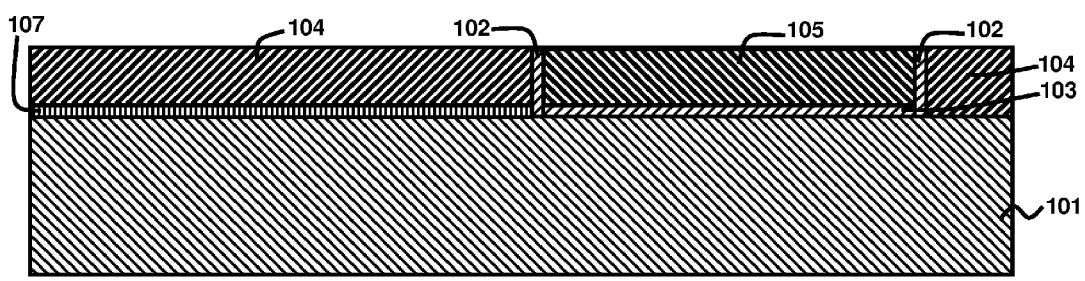

As depicted in FIG. 17, sacrificial sidewall spacers 102 are formed on both sides of the stack made up of the remaining layers of the SiGe layer 103, silicon layer 105, SiO$_2$ layer 100, and Si$_3$N$_4$ layer 106. These spacers may comprise CVD silicon dioxide or silicon nitride and are preferably approximately between 4 and 60 nm wide. The sidewall spacers 102 may be formed to a height just below the upper height of the Si$_3$N$_4$ layer 106. Next, a thin SiGe layer 107 having a preferred thickness approximately between 5 and 50 nm is epitaxially grown over the exposed substrate 101, followed by epitaxial growth of silicon layer 104, generally up to the height of the silicon layer 105 as shown in FIG. 18. Silicon layer 104 is preferably approximately between 3 and 50 nm thick, and comprises silicon having the same crystalline orientation as substrate 100. Thereafter, the structure is planarized by etching the SiO$_2$ layer 100, Si$_3$N$_4$ layer 106, and upper portions of the sidewall spacers 102 as shown in FIG. 19, using Chemical-Mechanical Polishing and/or RIE etch back.

Figure 20:
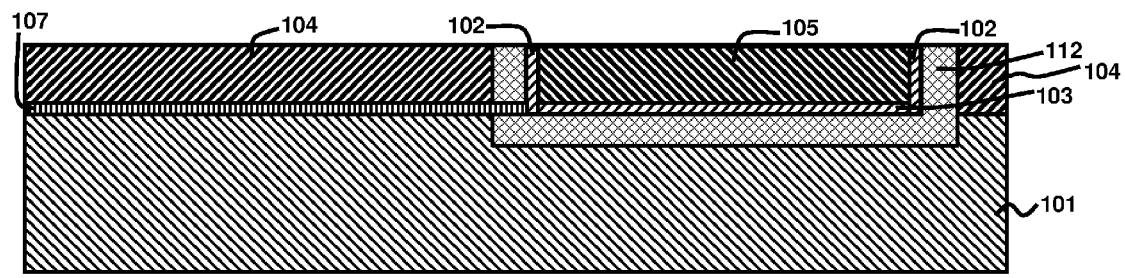
Figure 21:
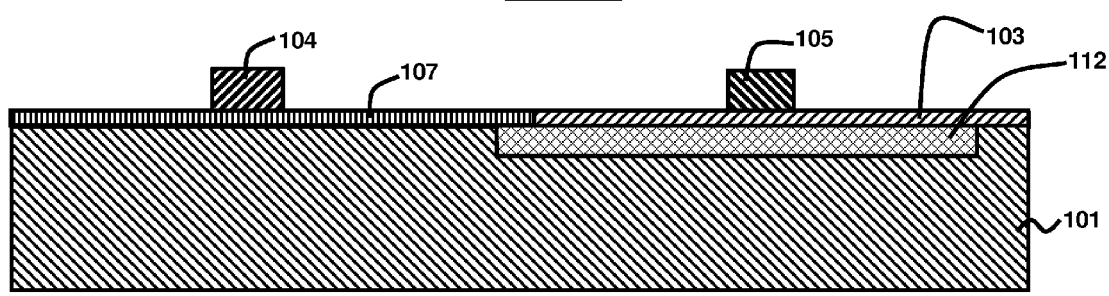

Next, an n-well implant region 112 is formed in the silicon layer 104 and extending into the substrate layer 101 and around the sidewall spacers 102 and below the SiGe layer 103 as illustrated in FIG. 20. Next, trigate fin regions 104, 105 are patterned with a photo-resist and a selective etching process is performed as illustrated in FIG. 21 to create fins from the silicon layer 104 and the silicon layer 105 The fin etch can be stopped when its depth extends to the bottom SiGe layer 103, and thus the SiGe region 107 will also be reached in fin 104. A selective oxidation of the exposed SiGe using O$_2$ at an approximate temperature of 600° C. follows. A buffered HF etch is used to remove the small amount of silicon dioxide grown on the exposed fin sidewall and top portions thereof during this oxidation process, leaving most of the oxidized SiGe region intact.

Figure 22:
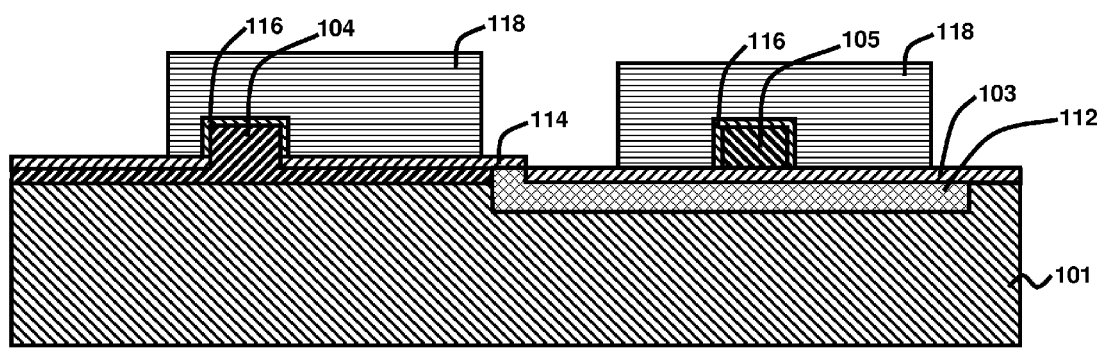
Figure 23:
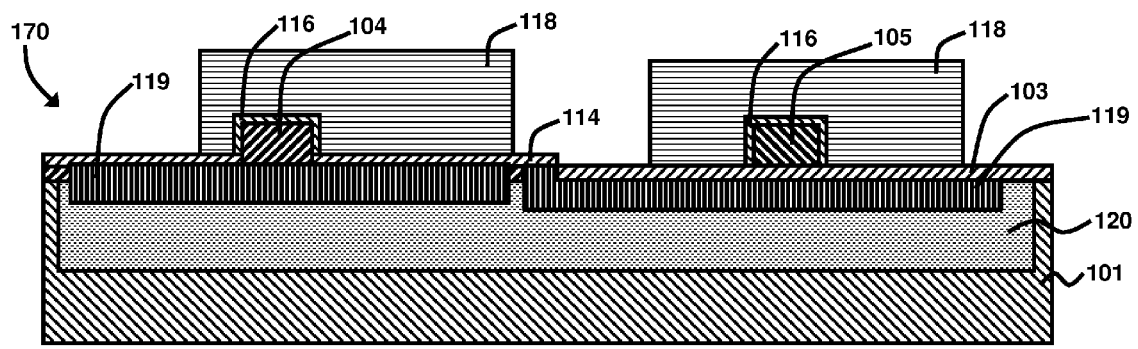

As depicted in FIG. 22, a gate dielectric material 116 is deposited by thermal oxidation/nitridation to form silicon oxynitride and/or use of ALD or CVD techniques to form a high-k material around each of the silicon layers 104, 105. The thickness of material 116 is preferably approximately between 1 and 50 nm. Following this process, a polysilicon layer 118 is deposited over the device, and is selectively patterned and etched to form gate electrodes. In a slightly alternative embodiment shown in FIG. 23, p-well implant regions 119 are formed along with an n-well implant region 120. Generally, according to the third embodiment of the invention, an n-well region 112 (FIG. 22) may be formed in the bulk p-type silicon layer 101. Alternatively, n-band-isolated p-well implant regions 119 may be formed in the bulk p-type silicon layer 101. Still alternatively, p-well implant regions (not shown) may be formed in a bulk n-type silicon layer. Those skilled in the art would readily understand that the n-well 112, 120 and p-well regions 119 could be interchanged. In yet another alternative embodiment, the SOI layer 101 may comprise silicon having a {110} crystalline orientation, where the PFET portion of the device 170 is in the bulk portion of the device 170 and the NFET portion of the device 170 is in the SOI layer 101. According to FIGS. 15 through 23, the bulk portion of the device 170 is generally defined by the left-hand portion of the device. In all of these embodiments, the wells described may be formed by use of conventional photolithography to pattern resist to form openings where wells are desired, and an ion implant of n-type or p-type species. In the case of the n-band the same mask can be used to implant the n-band as is used to implant the p-well by using higher energy, and thus deeper, implantation of the n-band (n-type) species (typically arsenic) as compared to the p-well (p-type) species (typically boron).

Generally, the third embodiment of the invention provides a HOT trigate device 170 which is electrical threshold-voltage control enabled, with one device in a SOI layer 101 and the other device in a bulk region. This provides a low-cost hybrid well and back-gate solution to electrically altering V$_t$ through well bias and back-gate bias, respectively. The well regions 112, 119, below the buried oxide 103, is effectively a back gate for trigate body 105. Setting the V$_t$ by electrical control enables less reliance on doping and thus better-controlled device V$_t$s, since doping fluctuation has less impact on V$_t$ variation when doping is lower, and since process-induced variation in V$_t$ can be corrected electrically with appropriate well and back-gate biases.

Figure 24:
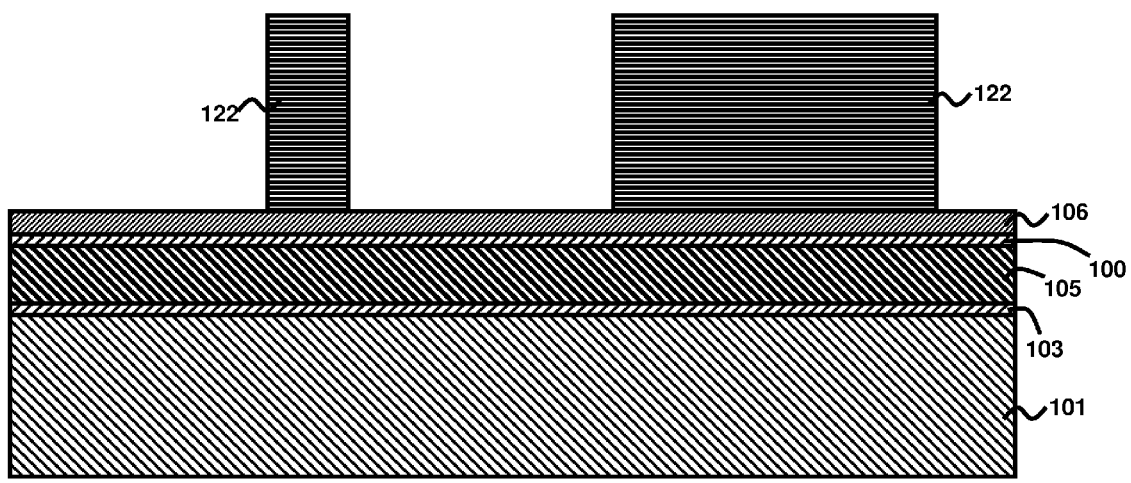
Figure 25:
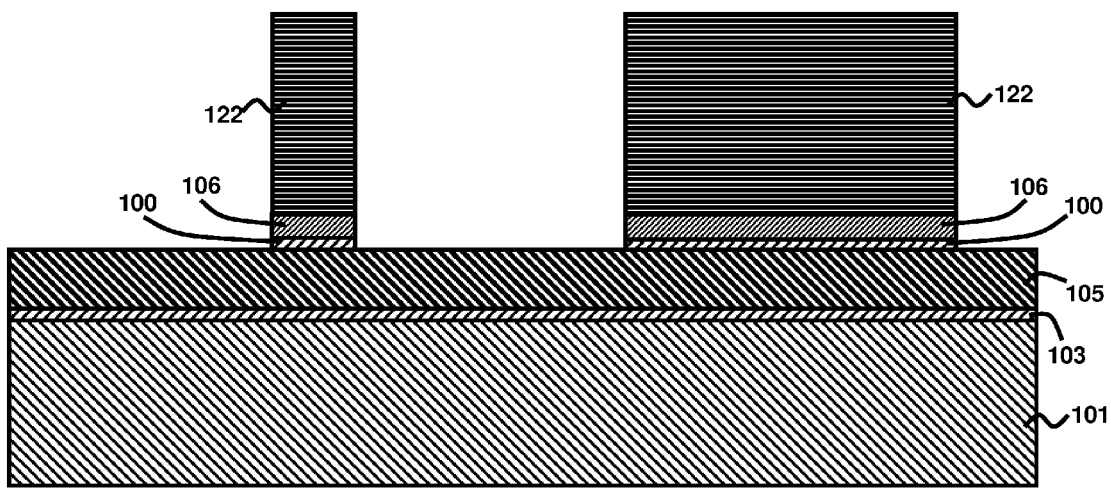

A fourth embodiment of the invention is illustrated in FIGS. 24 through 35(B). The same base substrate as was provided in the first, and second, embodiments including the bulk wafer 101, SiGe layer 103, and silicon layer 105 is formed. As with the third embodiment, as shown in FIG. 24, a SiO$_2$ layer 100 and a Si$_3$N$_4$ layer 106 are sequentially deposited over the silicon layer 105. The approximate thickness of SiO$_2$ layer 100 is preferably between 5 and 50 nm, while the approximate thickness of Si$_3$N$_4$ layer 106 is preferably between 5 and 50 nm. Next, a photoresist mask 122 is deposited and selectively patterned over the Si$_3$N$_4$ layer 106. Next, optionally, as illustrated in FIG. 25, a selective etching process is performed to remove portions of the SiO$_2$ layer 100 and Si$_3$N$_4$ layer 106, thereby exposing portions of the underling silicon layer 105.

Figure 26:
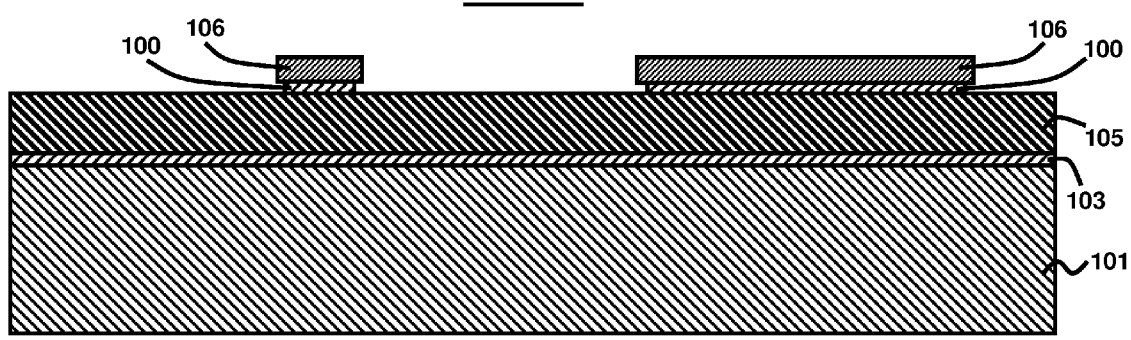
Figure 27:
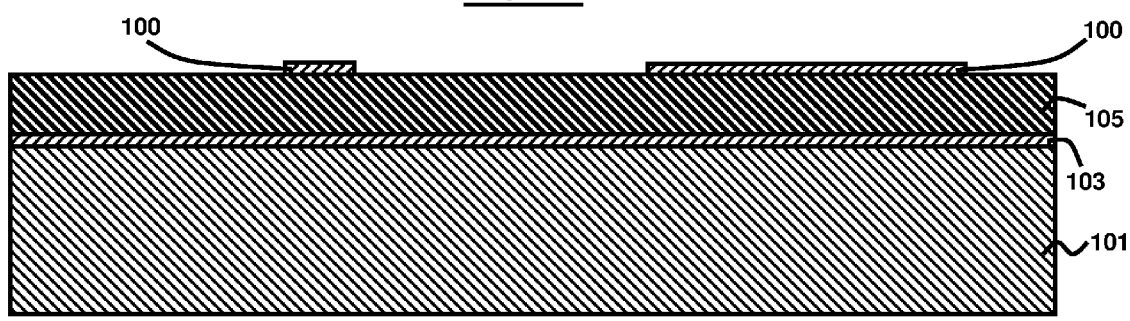
Figure 28:
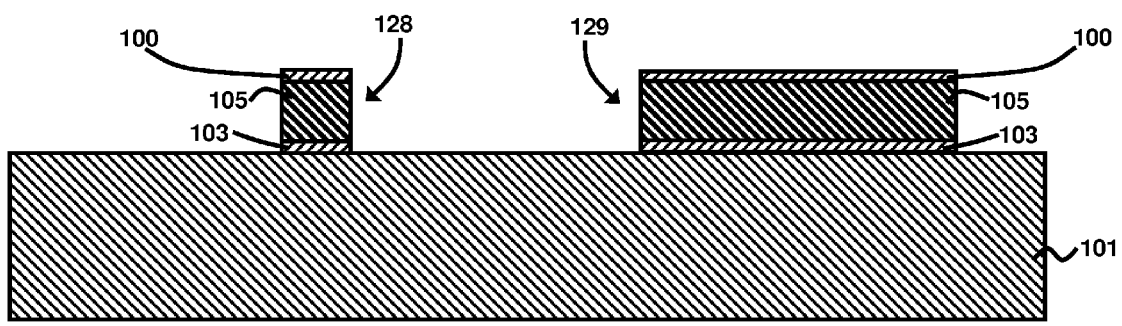
Figure 29:
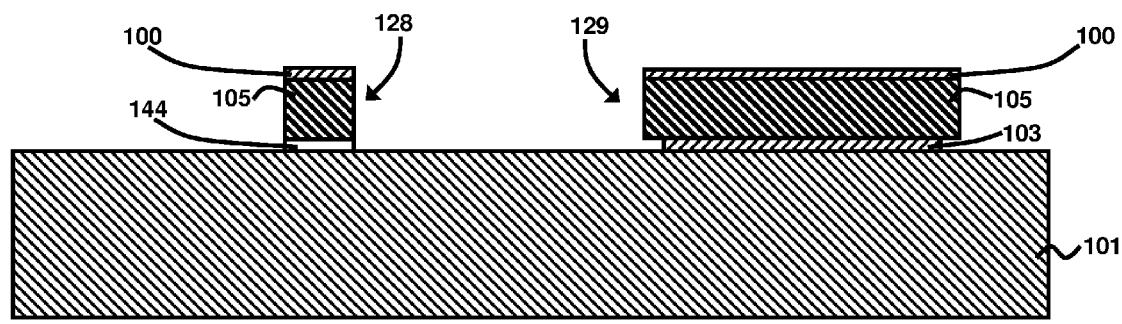

Thereafter, the photoresist mask 122 is stripped and the SiO$_2$ layer 100 is etched back such that the end portions of the SiO$_2$ layer 100 are removed as depicted in FIG. 26. Next, as illustrated in FIG. 27, the Si$_3$N$_4$ layer 106 is removed using well-known etching processes. As shown in FIG. 28, the structure is etched in areas unprotected by the SiO$_2$ layer 100 such that the upper silicon layer 105 and underlying SiGe layer 103 are removed in the exposed areas down to the top surface of the underlying silicon substrate layer 101 thereby creating one fin structure 128 and a mesa structure 129. FIG. 29 illustrates the structure after a selective etch back of the SiGe layer 103 occurs. This etch is of sufficient duration to completely undercut the fin 128, but not sufficient to undercut the mesa 129. The fin structure 128 on the left-hand side of the device shown in FIG. 29 is supported by source/drain regions 144, which because they are out-of-plane to the view shown in FIGS. 29 and 30, are depicted in non-hashed lines.

Figure 32:
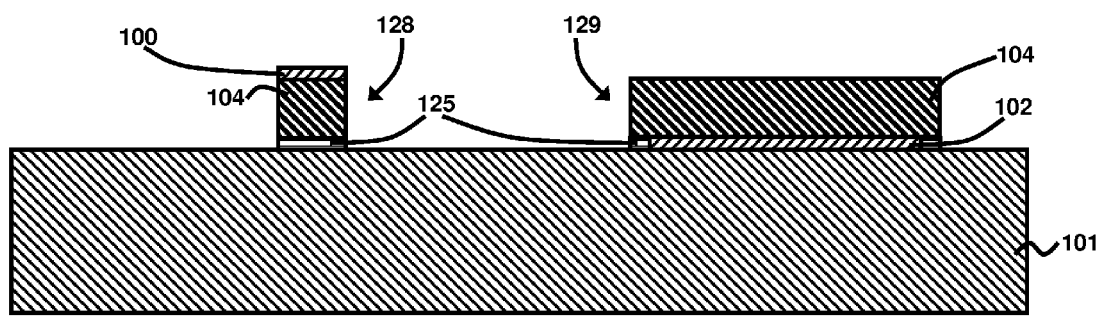

Next, a selective strip removal of the SiO$_2$ layer 100 occurs, whereby an optional mask (not shown) is patterned over left-hand fin structure 128 in FIG. 29, and the SiO$_2$ layer 100 over the wider fin structure 129 (right-hand fin structure 129 in FIG. 29) is removed. If the fin 128 is masked during the strip of the SiO$_2$ layer, the fin 128 will be gated only on the sides of structure 128. If fin 128 is not masked, then the top surface will also be gated and the fin can form a trigate transistor. The resulting device is illustrated in FIG. 30. Next, a conformal spacer 125 preferably comprising silicon nitride or silicon oxide, is deposited over the entire structure as depicted in FIG. 31. This spacer is preferably approximately between 2.5 to 3.5 times the width of fin 129. Thereafter, as shown in FIG. 32, a directional etching process is performed thereby resulting in the spacer 125 being removed except for the areas under the silicon layer 105 in both the left-hand fin structure 128 and the right-hand fin structure 129 in FIG. 32.

Figure 33:
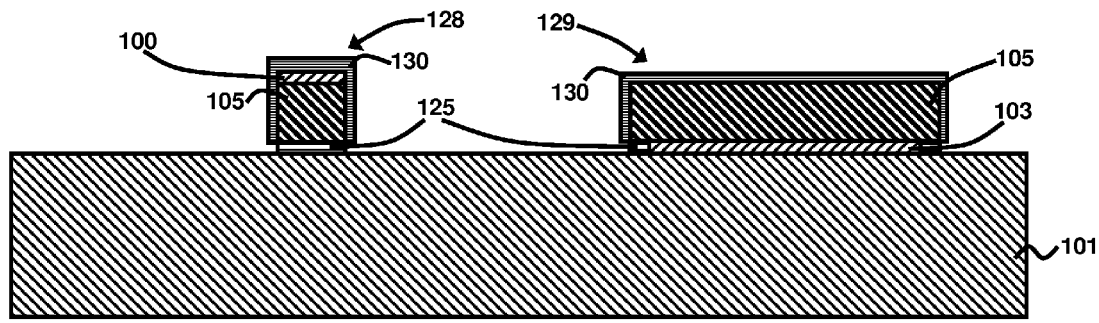
Figure 34:
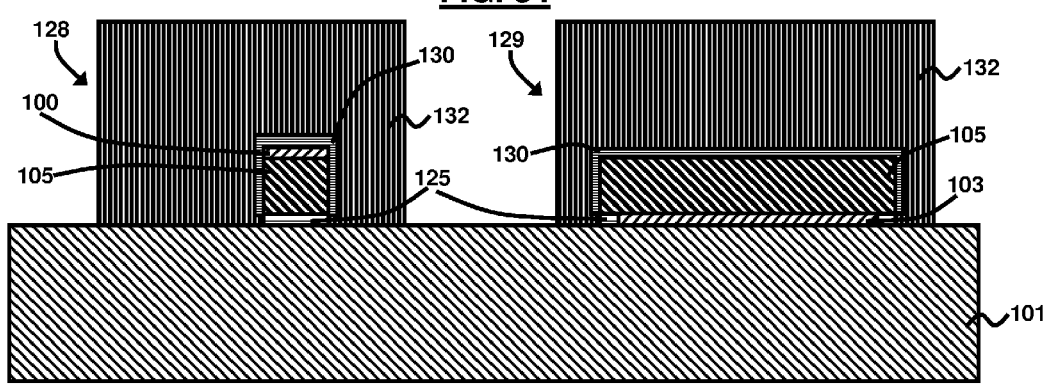

Next, a gate dielectric layer 130 is deposited over the fin structures 128, 129 as depicted in FIG. 33. Oxidation and/or nitridation to form silicon oxinitride and/or CVD/ALD to form high-k dielectrics can be used to form dielectric layer 130. Preferably, layer 130 is approximately between 1 and 5 nm thick. Next, a polysilicon layer 132 is deposited over the device as shown in FIG. 34 and is selectively etched over the corresponding fin structure 128 and mesa structure 129 to form gate electrodes. Preferably, the polysilicon layer 132 is greater than 2 times the height of the fins 128, 129.

Figure 35A:
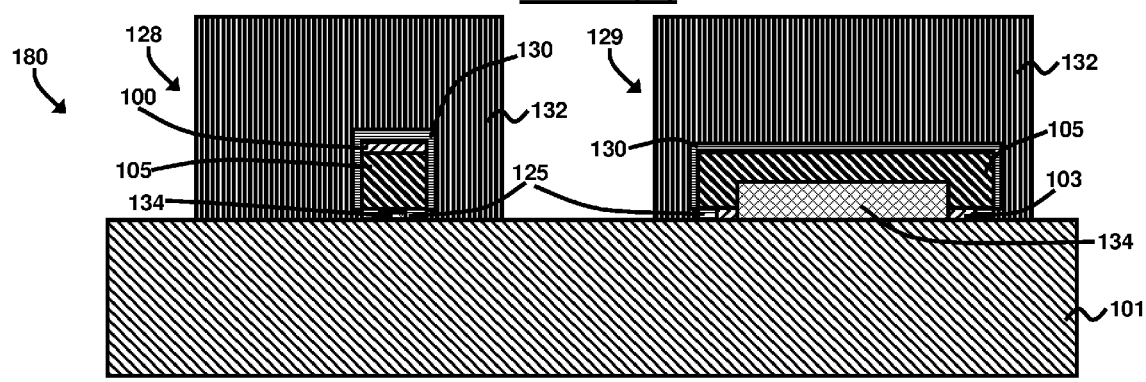
Figure 35B:
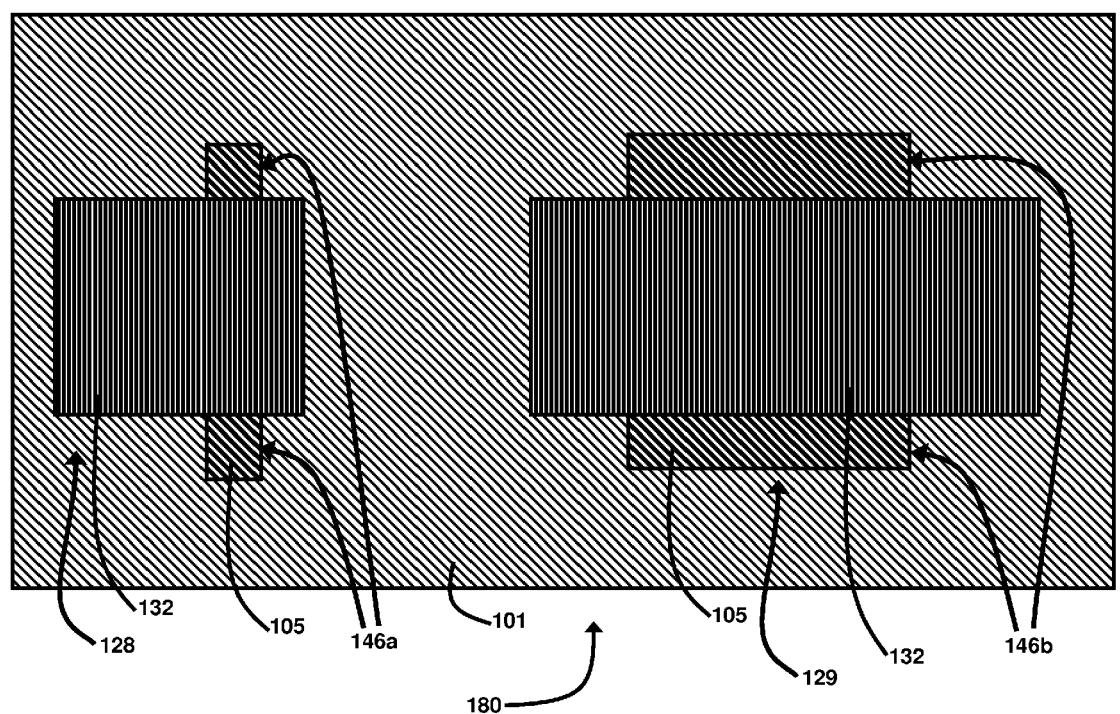

A space-charge region 134 is formed in each of the fin and mesa structures 128, 129, respectively, of the device 180 shown in FIG. 35(A). Region 134 becomes "space-charged" due to the electrical influence of the gate electrode 132 which repels a majority of electron carriers in the bodies of the transistors. Generally, fin structure 128 is the fully-depleted FinFET or trigate device and mesa structure 129 is the partially-depleted bulk-contacted body FET device. Structure 128 is made of a sufficiently small volume that the gate electrode depletes the entire fin (or body) of majority carriers, making it a so-called "fully depleted device", in contrast to mesa structure 129 by virtue of the SiGe/Si layer 103/101 being contiguous with silicon layer 105, which has a very large volume, and effectively only a portion of the body of the device can be depleted of majority carriers by the gate electrode 132, and hence is referred to as "partially depleted". Additionally, well regions (not shown) may be implanted in the device 180 to form a PFET and NFET structure according to well-known procedures. FIG. 35(B) illustrates a top view of the device 180 of FIG. 35(A) further illustrating the source/drain regions 146a of the fin structure 128 and the source/drain regions 146b of the fin structure 129 with the respective polysilicon gate region 132 of each fin 128, 129.

The fourth embodiment of the invention provides both an insulator-isolated FinFET or trigate device 128 and a bulk, partially-depleted FET 129 with body contact in a low-cost, low-capacitance process. Thus, the fourth embodiment of the invention provides isolation of bulk trigate fins 105 from the substrate 101 with well-controlled fin height, which is key to $V_t$ control in trigate structures, and well-controlled isolation of the bulk parasitic channel. The fin height is controlled accurately by virtue of the SiGe layer 103, which allows one to construct fin height equal to the thickness of the silicon layer 105 above the SiGe layer 103. Furthermore, the partially depleted FET 129 can have $V_t$ further adjusted by application of electrical bias to the its substrate 101. The fourth embodiment of the invention utilizes SiGe-based bulk integration for generating FinFETs and/or trigates on a bulk substrate 101. By the addition of a limited selective etch back of the SiGe layer 103, followed by a thin oxide fill process, the fourth embodiment of the invention achieves both oxide-isolated fins and bulk-connected FETs.

The several embodiments of the invention can be formed into integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the embodiments of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention has been described in terms of preferred embodiments, those skilled in the art will recognize that the embodiments of the invention can be practiced with modification within the spirit and scope of the appended claims.

What is claimed is:

1. A method of manufacturing a field effect transistor (FET), said method comprising:
    forming a first semiconductor layer on a substrate;
    forming a second semiconductor layer on said first semiconductor layer, said second semiconductor layer being different from said first semiconductor layer;
    performing a first etch process that etches said first semiconductor layer and said second semiconductor layer to form a rectangular-shaped body on said substrate;
    performing a second etch process that etches back sides of said first semiconductor layer to form, from said rectangular-shaped body, an essentially T-shaped body comprising a relatively narrow lower section on said substrate and a relatively wide upper section above said lower section;
    forming a first gate structure adjacent to said T-shaped body such that said first gate structure is positioned laterally adjacent to said lower section, is positioned between said substrate and said upper section and extends the length of said T-shaped body; and
    after said forming of said first gate structure, forming a second gate structure adjacent to said T-shaped body such that said second gate structure has a horizontal section traversing a top surface of said upper section and vertical sections extending from said substrate to said horizontal section.

2. The method of claim 1, said forming of said first gate structure comprising:
    forming a conformal first gate dielectric layer over said substrate and said T-shaped body;
    forming a conformal first gate conductor layer over said first gate dielectric layer; and
    performing a third etch process that anisotropically etches said first gate conductor layer to form said first gate structure.

3. The method of claim 1, said forming of said second gate structure comprising:
    forming a second gate dielectric layer over any exposed surfaces of said T-shaped body, said first gate structure and said substrate;
    forming a blanket second gate conductor layer; and
    patterning said second gate conductor layer to form said second gate structure over a center portion of said T-shaped body, substantially transverse to said first gate structure.

4. The method of claim 2, further comprising, after said forming of said first gate conductor layer and before said performing of said third etch process, forming a mask covering a portion of said first gate conductor layer adjacent to said T-shaped body such that said performing of said third etch process simultaneously forms a contact region to said first gate structure.

5. The method of claim 1, said performing for said second etch process comprising:
   performing an oxidation process that oxidizes said first semiconductor layer at a faster rate than said second semiconductor layer; and
   performing an isotropic oxide etch process.

6. The method of claim 1, said forming of said second gate structure further comprising forming said second gate structure to have a height that is approximately twice a height of said T-shaped body.

7. The method of claim 1, said forming of said first semiconductor layer comprising carbon-doping said first semiconductor layer.

8. A method of manufacturing a field effect transistor (FET), said method comprising:
   forming an essentially T-shaped body on a substrate, said T-shaped body comprising a relatively narrow lower section on said substrate and a relatively wide upper section above said lower section;
   forming a first gate structure adjacent to said T-shaped body such that said first gate structure is positioned laterally adjacent to said lower section, is positioned between said substrate and said upper section and extends the length of said T-shaped body; and
   after said forming of said first gate structure, forming a second gate structure adjacent to said T-shaped body such that said second gate structure has a horizontal section traversing a top surface of said upper section and vertical sections extending from said substrate to said horizontal section.

9. The method of claim 8, said forming of said first gate structure comprising:
   forming a conformal first gate dielectric layer over said substrate and said T-shaped body;
   forming a conformal first gate conductor layer over said first gate dielectric layer; and
   anisotropically etching said first gate conductor layer to form said first gate structure.

10. The method of claim 8, said forming of said second gate structure comprising:
    forming a second gate dielectric layer over any exposed surfaces of said T-shaped body, said first gate structure and said substrate;
    forming a blanket second gate conductor layer; and
    patterning said second gate conductor layer to form said second gate structure over a center portion of said T-shaped body, substantially transverse to said first gate structure.

11. The method of claim 9, further comprising, after said forming of said first gate conductor layer and before said anisotropically etching, forming a mask covering a portion of said first gate conductor layer adjacent to said T-shaped body such that said anisotropically etching simultaneously forms a contact region to said first gate structure.

12. The method of claim 8, said forming of said second gate structure further comprising forming said second gate structure to have a height that is approximately twice a height of said T-shaped body.

13. The method of claim 8, said forming of said T-shaped body comprising doping said lower section with carbon.

14. A method of manufacturing a field effect transistor (FET), said method comprising:
    providing a bulk silicon substrate;
    forming a carbon-doped silicon germanium (SiGe) layer on said substrate;
    forming a silicon layer on said SiGe layer;
    performing a first etch process that etches said silicon layer and said SiGe layer to form a rectangular-shaped body on said substrate;
    performing a second etch process that etches back sides of said SiGe layer to form, from said rectangular-shaped body, an essentially T-shaped body comprising a relatively narrow lower section on said substrate and a relatively wide upper section above said lower section;
    forming a first gate structure adjacent to said T-shaped body such that said first gate structure is positioned laterally adjacent to said lower section, is positioned between said substrate and said upper section and extends the length of said T-shaped body; and
    after said forming of said first gate structure, forming a second gate structure adjacent to said T-shaped body such that said second gate structure has a horizontal section traversing a top surface of said upper section and vertical sections extending from said substrate to said horizontal section.

15. The method of claim 14, said forming of said first gate structure comprising:
    forming a conformal first gate dielectric layer over said substrate and said T-shaped body;
    forming a conformal first gate conductor layer over said first gate dielectric layer; and
    performing a third etch process that anisotropically etches said first gate conductor layer to form said first gate structure.

16. The method of claim 14, said forming of said second gate structure comprising:
    forming a second gate dielectric layer over any exposed surfaces of said T-shaped body, said first gate structure and said substrate;
    forming a blanket second gate conductor layer; and
    patterning said second gate conductor layer to form said second gate structure over a center portion of said T-shaped body, substantially transverse to said first gate structure.

17. The method of claim 15, further comprising, after said forming of said first gate conductor layer and before said performing of said third etch process, forming a mask covering a portion of said first gate conductor layer adjacent to said T-shaped body such that said performing of said third etch process simultaneously forms a contact region to said first gate structure.

18. The method of claim 14, said performing for said second etch process comprising:
    performing an oxidation process that oxidizes said SiGe layer at a faster rate than said silicon layer; and
    performing an isotropic oxide etch process.

19. The method of claim 14, said forming of said second gate structure further comprising forming said second gate structure to have a height that is approximately twice a height of said T-shaped body.

* * * * *